United States Patent
Wu et al.

(10) Patent No.: US 7,187,046 B2
(45) Date of Patent: Mar. 6, 2007

(54) METHOD OF FORMING AN N CHANNEL AND P CHANNEL FINFET DEVICE ON THE SAME SEMICONDUCTOR SUBSTRATE

(75) Inventors: Chung-Cheng Wu, Hsin-Chu (TW); Shye-Lin Wu, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/831,868

(22) Filed: Apr. 26, 2004

(65) Prior Publication Data
US 2004/0195628 A1 Oct. 7, 2004

Related U.S. Application Data

(62) Division of application No. 10/235,253, filed on Sep. 5, 2002, now Pat. No. 6,770,516.

(51) Int. Cl.
*H01L 29/76* (2006.01)
(52) U.S. Cl. ............... 257/412; 257/E21.442; 257/347
(58) Field of Classification Search ........ 257/250, 257/270, 300, 308, 328, 329, 347–351, 353, 257/365, 368, 369, 412, E21.442
See application file for complete search history.

(56) References Cited

U.S. PATENT DOCUMENTS

| | | | |
|---|---|---|---|
| 6,252,284 B1 * | 6/2001 | Muller et al. ............... 257/412 |
| 6,300,182 B1 * | 10/2001 | Yu ............................ 438/217 |
| 6,413,802 B1 * | 7/2002 | Hu et al. ..................... 438/151 |
| 6,451,656 B1 * | 9/2002 | Yu et al. ..................... 438/283 |
| 6,657,259 B2 * | 12/2003 | Fried et al. ................. 257/350 |
| 6,974,729 B2 * | 12/2005 | Collaert et al. ............. 438/157 |

OTHER PUBLICATIONS

Rainey et al. "Demonstration of FinFET CMOS circuits," Device Research Conference, 2002 60th DRC. Conference Digest, Jun. 24-26, 2002 pp. 47-48.*

* cited by examiner

*Primary Examiner*—Thomas L. Dickey
(74) *Attorney, Agent, or Firm*—Thomas, Kayden, Horstemeyer & Risley (57) ABSTRACT

A method of forming a FINFET CMOS device structure featuring an N channel device and a P channel device formed in the same SOI layer, has been developed. The method features formation of two parallel SOI fin type structures, followed by gate insulator growth on the sides of the SOI fin type structures, and definition of a conductive gate structure formed traversing the SOI fin type structures while interfacing the gate insulator layer. A doped insulator layer of a first conductivity type is formed on the exposed top surfaces of a first SOI fin type shape, while a second doped insulator layer of a second conductivity type is formed on the exposed top surfaces of the second SOI fin type shape. An anneal procedure results creation of a source/drain region of a first conductivity type in portions of the first SOI fin type shape underlying the first doped insulator layer, and creation of a source/drain region of a second conductivity type in portions of the second SOI fin type shape underlying the second doped insulator layer. Selective deposition of tungsten on exposed top surface of the source/drain regions is then employed to decrease source/drain resistance.

10 Claims, 10 Drawing Sheets

FIG. 11B

METHOD OF FORMING AN N CHANNEL AND P CHANNEL FINFET DEVICE ON THE SAME SEMICONDUCTOR SUBSTRATE

This is a division of patent aqpplication Ser. No. 10/235,253, filing date Sep. 5, 2002 now U.S. Pat. No. 6,770,516, Method Of Forming An N Channel And P Channel Finfet Device On The Same Semiconductor Substrate, assigned to the same assignee as the present invention, which is herein incorporated by reference in its entirety.

BACKGROUND OF THE INVENTION

(1) Field of the Invention

The present invention relates to methods used to fabricate semiconductor devices, and more specifically to a method used to fabricate a fin type field effect transistor (FINFET) device on a semiconductor substrate.

(2) Description of Prior Art

Micro-miniaturization, the ability to fabricate semiconductor devices comprised with sub-micron features, has allowed the performance of devices comprised with the sub-micron features to be increased. In addition the use of sub-micron features has allowed the attainment of smaller semiconductor chips to be realized, still providing device density equal to, or greater than, counterpart semiconductor chips formed with larger features, therefore allowing a greater number of semiconductor chips to be obtained from a specific size starting silicon wafer thus reducing the processing costs for a specific semiconductor chip. However as device features shrink specific parameters such as short channel effects, punch through, and leakage currents become more prevalent for devices formed with sub-micron features than for counterparts formed with larger features. The ability to fabricate a FINFET type device entirely in a silicon in insulator (SOI) layer, has allowed miniaturization of device features to be successfully accomplished with less risk of the yield degrading phenomena such as short channel effects, punch through leakages, and leakage current, when compared to counterpart devices formed in a semiconductor substrate. In addition the FINFET device, formed on an insulator layer, results in less junction capacitance, thus increased performance, when compared to the above counterpart devices formed in the semiconductor material.

The use of FINFET type devices however has mainly been applied to a single type metal oxide semiconductor field effect transistor (MOSFET), device, either an N channel (NMOS), device, or a P channel (PMOS), device. The ability to fabricate a complimentary metal oxide semiconductor (CMOS), device, comprised with both NMOS and PMOS devices, has been difficult to achieve for FINFET type devices. This invention will describe a novel process sequence in which the attractive advantages of FINFET devices can be realized for both NMOS and PMOS elements, formed in the same SOI layer. In addition this invention will describe additional process sequences allowing source/drain, as well as gate resistances for the FINFET device, to be reduced, thus providing additional performance enhancements. Prior art, such as Wu, in U.S. Pat. No. 6,010,934, Wu, in U.S. Pat. No. 6,117,711, and Muller et al, in U.S. Pat. No. 6,252,284 B1, describe methods of forming FIN type devices, however none of these prior arts describe the novel process sequence of this present invention in which a NMOS and a PMOS FINFET device are formed in the same SOI layer.

SUMMARY OF THE INVENTION

It is an object of this invention to fabricate both an NMOS FINFET, and a PMOS FINFET device in the same SOI layer.

It is another object of this invention to dope source/drain regions of both the NMOS and PMOS elements of the CMOS FINFET device, via out diffusion from overlying doped insulator layers.

It is still another object of this invention to decrease FINFET source/drain resistance via use of a selectively deposited, overlying metal layer.

It is still yet another object of this invention to reduce FINFET gate resistance via use of dummy silicon fins, or via a reduction in spacing between the silicon fins.

In accordance with the present invention a method of forming both NMOS and PMOS FINFET devices in the same SOI layer, is described. Fin type structures used to accommodate a subsequent NMOS FINFET device and a subsequent PMOS device, are formed in an SOI layer, each comprised with an overlying insulator shape. After formation of a gate insulator layer on the sides of the FIN type structures, a conductive gate structure is defined, normal in direction to, and traversing the FIN type structures. Insulator spacers are formed on the sides of the gate structure as well as on the sides of the insulator shape—FIN type structures. Removal of the insulator shapes expose top surfaces of SOI for the portions of FIN type structures not covered by the conductive gate structure. An N type doped insulator layer is formed overlying a first FIN type structure, to be used for the NMOS FINFET device, while a P type doped insulator layer is provided overlying the second FIN type structure to be used for the PMOS FINFET device. An anneal procedure results in an NMOS FINFET device, with the exposed portions of the first FIN type structure now an N type source/drain region, and results in a PMOS FINFET device, with the exposed portions of the second FIN type structure now a P type source/drain region. After removal of the doped insulator layers, selective metal deposition on the top surface of both N type, and P type source/drain regions is performed.

A second embodiment of this invention entails the use of dummy fin structures located between the NMOS and PMOS fin structures, allowing the deposition of the material used for the conductive gate to fill the spaces between the fin structures, thus reducing gate resistance when compared to counterparts in which the conductive gate material only contoured the fin type structures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENT

Figure 1:
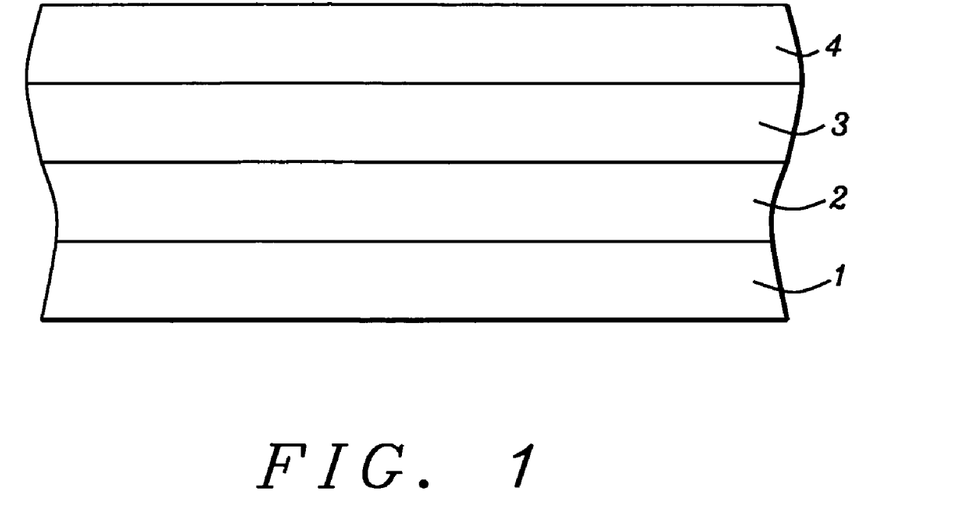
FIGS. 1, 2, 3B, 4B, 4C, 5B, 5C, 6, 7B, 8B, 9B, 10, and 11B which schematically, in cross-sectional style, describe key fabrication stages used for formation of both NMOS and PMOS FINFET devices in the same SOI layer.

The method of forming an NMOS FINFET device, and a PMOS FINFET device, in the same SOI layer, featuring reductions in source/drain and gate resistance, will now be described in detail. Semiconductor substrate 1, comprised of single crystalline silicon with a <100> crystallographic orientation, is used and schematically shown in FIG. 1. Silicon layer 3, the silicon component of an SOI layer, is formed via oxygen implantation into a portion of semiconductor substrate 1, followed by an anneal procedure which results in the formation of insulator layer 2, underlying non-implanted, and non-oxidized silicon layer 3. Insulator layer 2, is comprised of silicon dioxide at a thickness between about 100 to 1000 Angstroms, while SOI layer 3, the remaining top portion of semiconductor substrate 1, overlying insulator layer 2, is maintained at a thickness between about 50 to 5000 Angstroms. If desired the SOI configuration can be obtained via bonding of a first semiconductor substrate to the top surface of an insulator layer located on a second semiconductor substrate. Removal of the bottom portion of the second semiconductor substrate via chemical mechanical polishing (CMP), procedures, results in a remaining portion of the second semiconductor substrate, SOI layer 3, on insulator layer 2, of the first semiconductor substrate, again resulting in the desired SOI configuration. Insulator layer 4, comprised of silicon oxide at a thickness between about 50 to 5000 Angstroms, is next deposited on SOI layer 3, via low pressure chemical vapor deposition (LPCVD), or via plasma enhanced chemical vapor deposition (PECVD), procedures.

Figure 2:
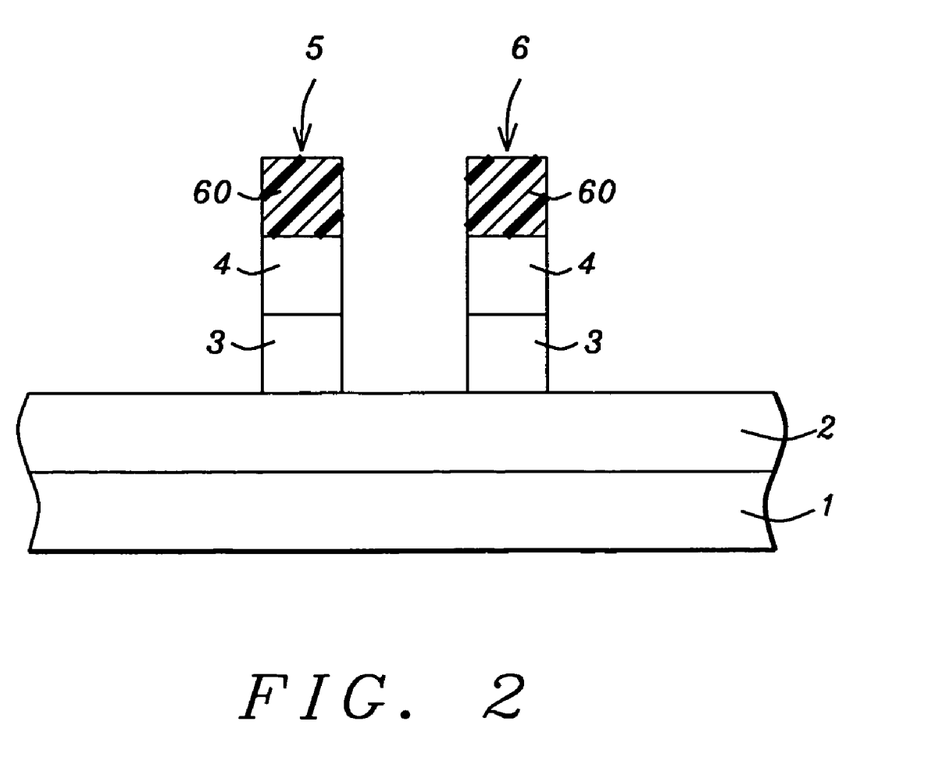

Photoresist shapes 60, are next formed and used as an etch mask to allow an aniosotropic reactive ion etch (RIE), procedure to define NMOS fin shape 5, and PMOS fin shape 6, in insulator layer 4, and in SOI layer 3. This is schematically shown in FIG. 2. The RIE procedure is performed using $CHF_3$ as an etchant for insulator layer 4, while $Cl_2$ or $SF_6$ is used as a selective etchant for SOI layer 3, with the RIE procedure selectively terminating at the top surface of insulator layer 2. The width of NMOS fin shape 5, and of PMOS fin shape 6, is between about 50 to 1000 Angstroms.

Figure 3A:
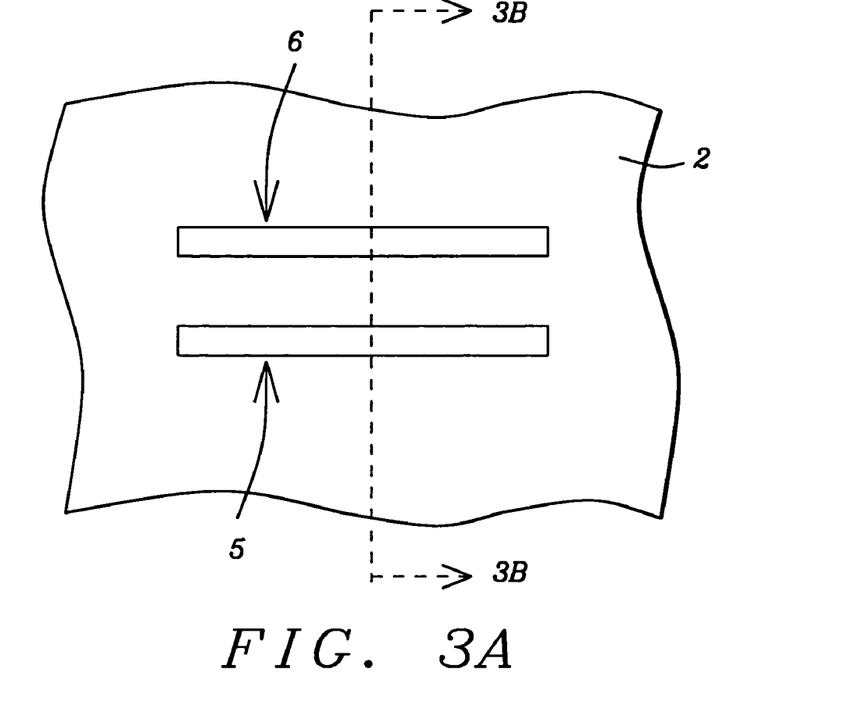
FIGS. 3A, 4A, 5A, 7A, 8A, 9A, and 11A which schematically show a top view of the FINFET device at specific stages of fabrication.
Figure 3B:
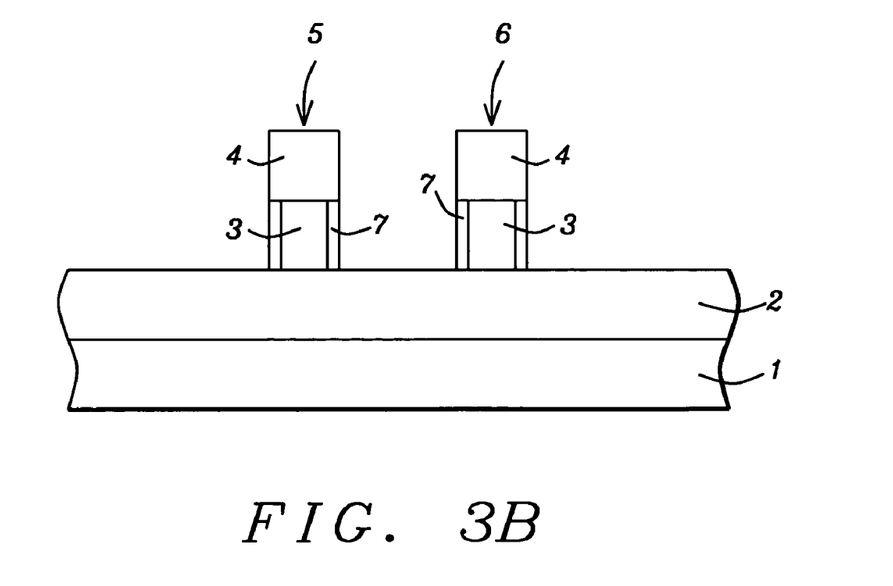

After removal of photoresist shapes 60, via plasma oxygen ashing procedures, a thermal oxidation procedure is performed at a temperature between about 700 to 1000° C., in an oxygen-steam ambient, resulting in the formation of silicon dioxide gate insulator layer 7, on both sides of NMOS fin shape 5, and PMOS fin shape 6. Silicon dioxide gate insulator layer 7, at a thickness between about 10 to 100 Angstroms, is schematically shown, in cross-sectional style in FIG. 3B. A top view of the fin shaped structures is schematically shown in FIG. 3A.

Figure 4A:
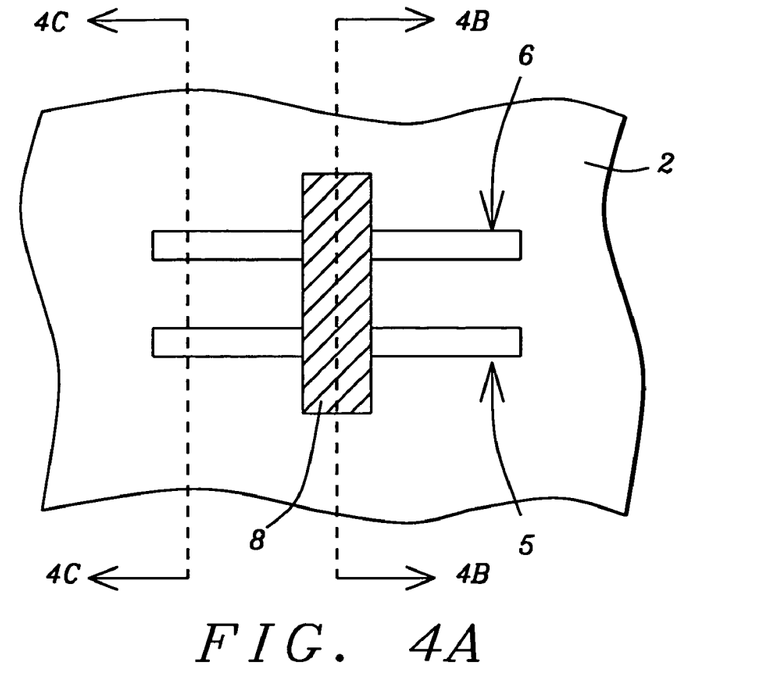
Figure 4B:
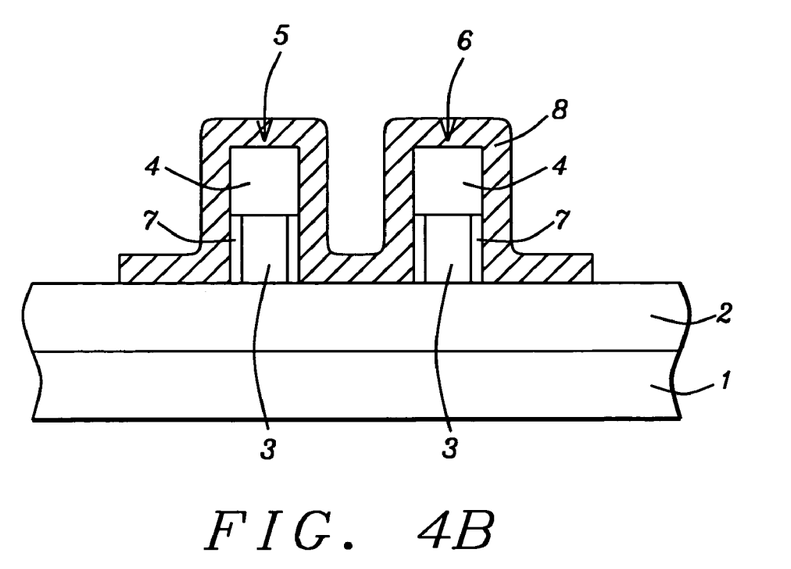
Figure 4C:
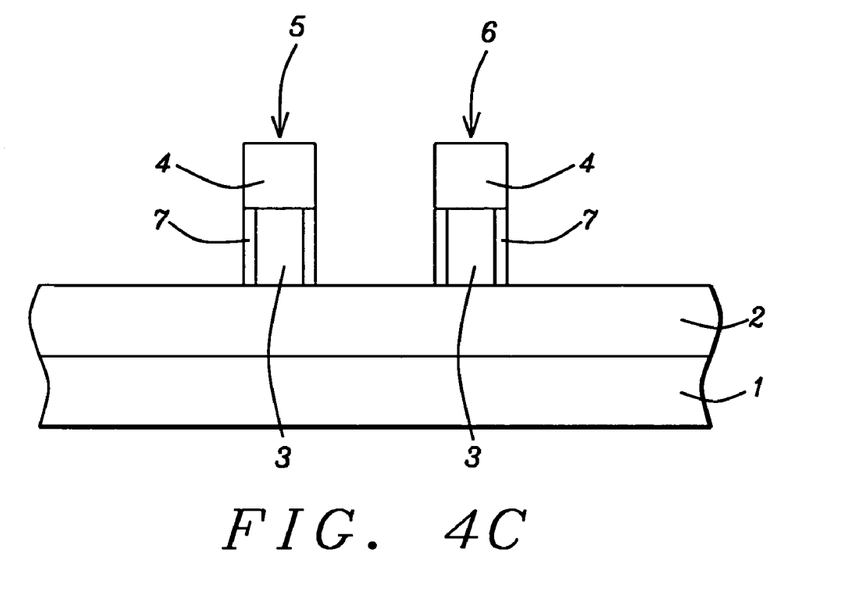

A conductive layer such as a doped polysilicon layer, a metal layer, or a metal silicide layer, is next deposited via chemical vapor deposition (CVD), or via plasma vapor deposition (PVD), procedures, to a thickness between about 100 to 3000 Angstroms. The metal layer option can be exercised using aluminum, aluminum-copper, tungsten, or tantalum, while the metal silicide option can employed using a layer such tungsten silicide, titanium silicide, tantalum silicide, nickel silicide, cobalt silicide, or zirconium silicide. A photoresist shape, not shown in the drawings, is used as an etch mask to allow an anisotropic RIE procedure, using $Cl_2$ or $SF_6$ as an etchant, to define gate structure 8. This is schematically shown as a top view in FIG. 4A, while a cross-sectional view of gate structure 8, is schematically shown in FIG. 4B. Gate structure 8, traversing both fin shapes, and with gate insulator residing on both sides of the fin shapes, results in a double gate FINFET structure 5, which will subsequently be processed to evolve as a double gate NMOS FINFET device, and results in a double gate FINFET structure 6, which will subsequently be processed to form a double gate PMOS FINFET device. FIG. 4C, a cross-sectional view of non-gate regions, regions in which the conductive layer was removed, shows portions of the undoped SOI shapes, not covered by gate structure 8. The photoresist shape used for definition of the conductive gate structure is removed via plasma oxygen ashing.

Figure 5A:
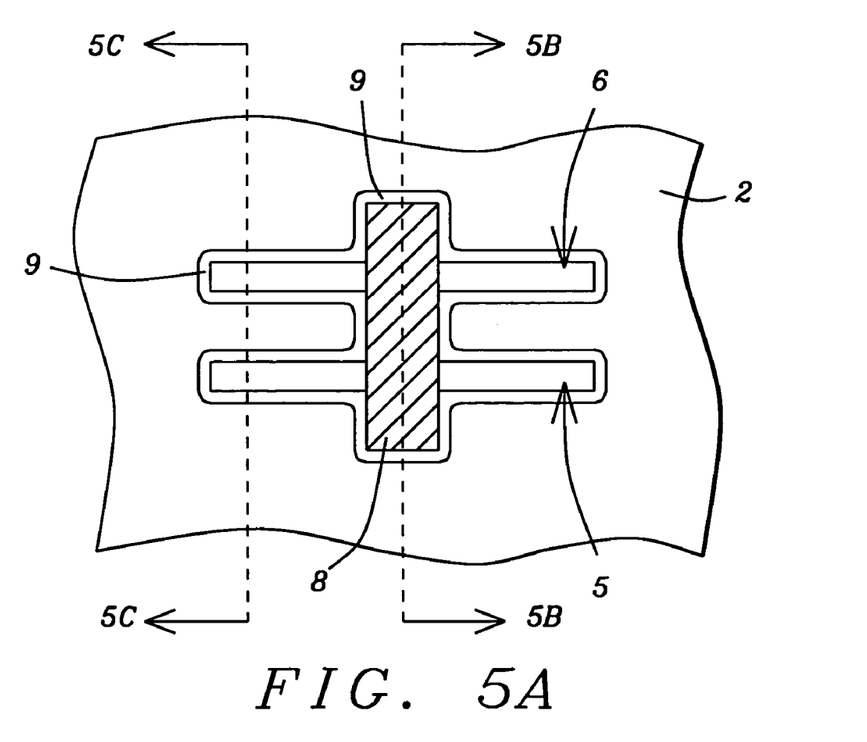
Figure 5B:
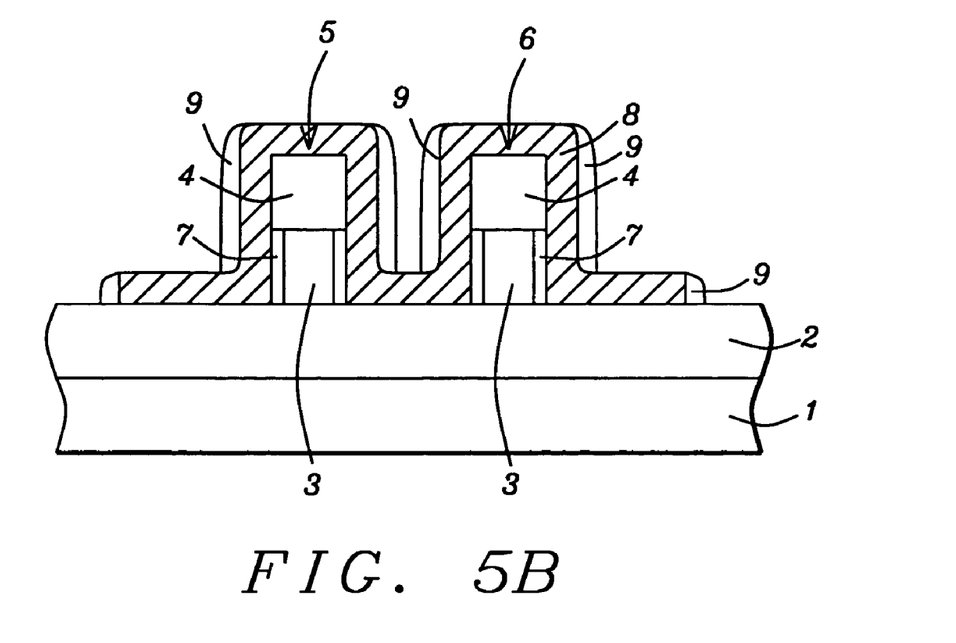

To subsequently form N type and P type source/drain regions in the undoped portions of the SOI shapes, or in the portions of FINFET structure 5, and FINFET structure 6, not covered by gate structures, a silicon nitride sidewall spacer has to be employed. A silicon nitride layer is deposited via LPCVD or PECVD procedures, to a thickness between about 300 to 5000 Angstroms. An anisotropic RIE procedure, using $CF_4$ or $Cl_2$ as an etchant, is used to define silicon nitride spacers 9, on the sides of the FINFET shapes, as well as on the sides of gate structure 8. This is schematically shown as a top view in FIG. 5A, while FIGS. 5B and 5C, schematically show the definition of the silicon nitride spacers on FINFET shapes and on the gate structure in cross-sectional style.

Figure 5C:
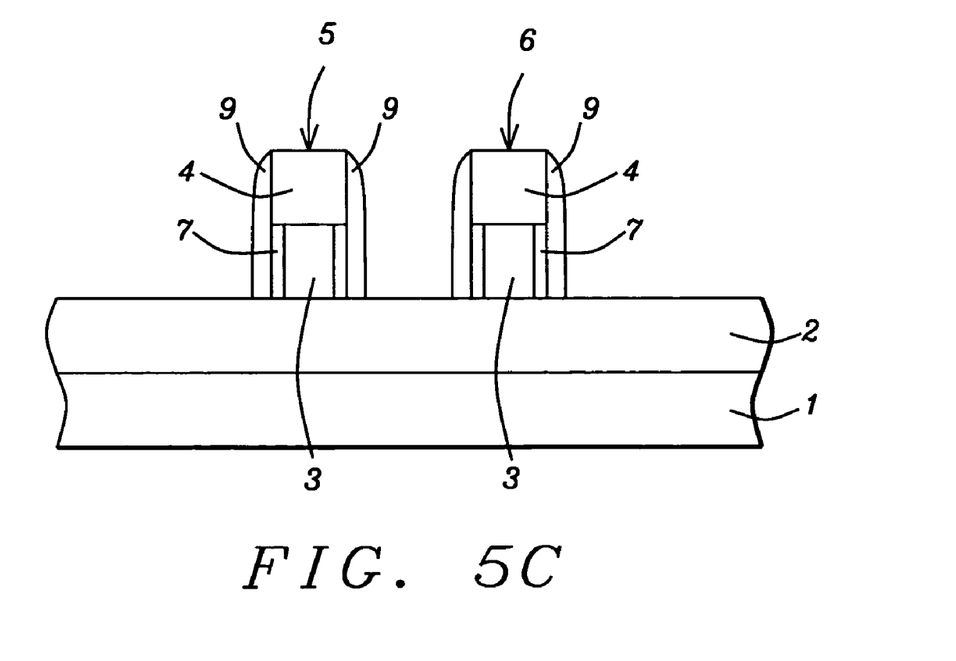
Figure 6:
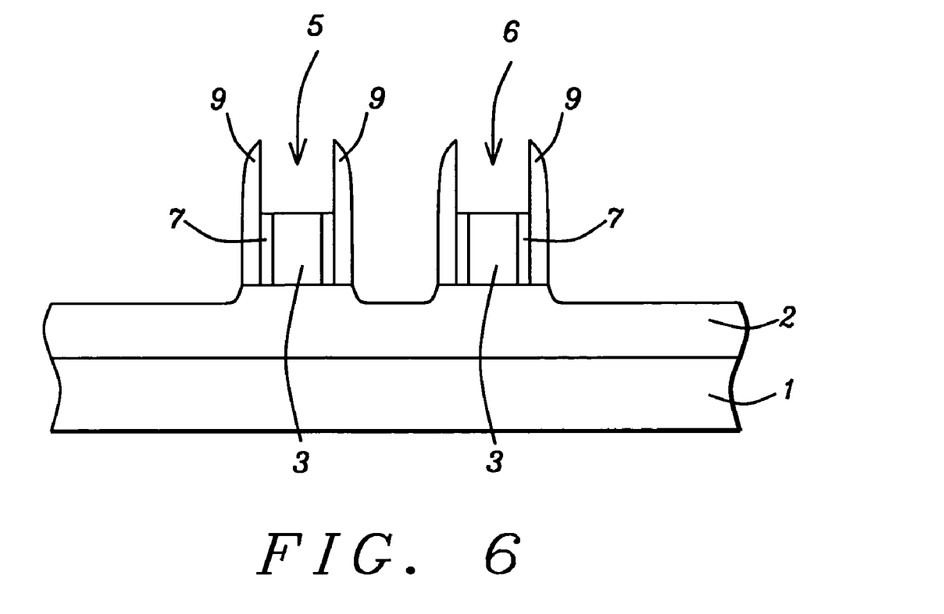

The presence of silicon nitride spacers 9, on the sides of the FINFET shapes, as previously shown in FIG. 5C, allow selective removal of insulator shapes 4, from the FINFET shapes to be accomplished, exposing the top surface of SOI shape 3, in FINFET shape 5, to be used for subsequent accommodation of an NMOS FINFET source/drain region, and exposing the top surface of SOI shape 3, in FINFET shape 6, to be used for subsequent accommodation of a PMOS FINFET source/drain region. The anisotropic RIE procedure used to remove insulator shapes 4, is performed using $CHF_3$ as a selective etchant for silicon oxide. This procedure also removes top portions of insulator layer 2, not covered by FINFET or gate structures. Silicon nitride spacers 9, protected silicon dioxide gate insulator layer 7, during this RIE procedure.

Figure 7A:
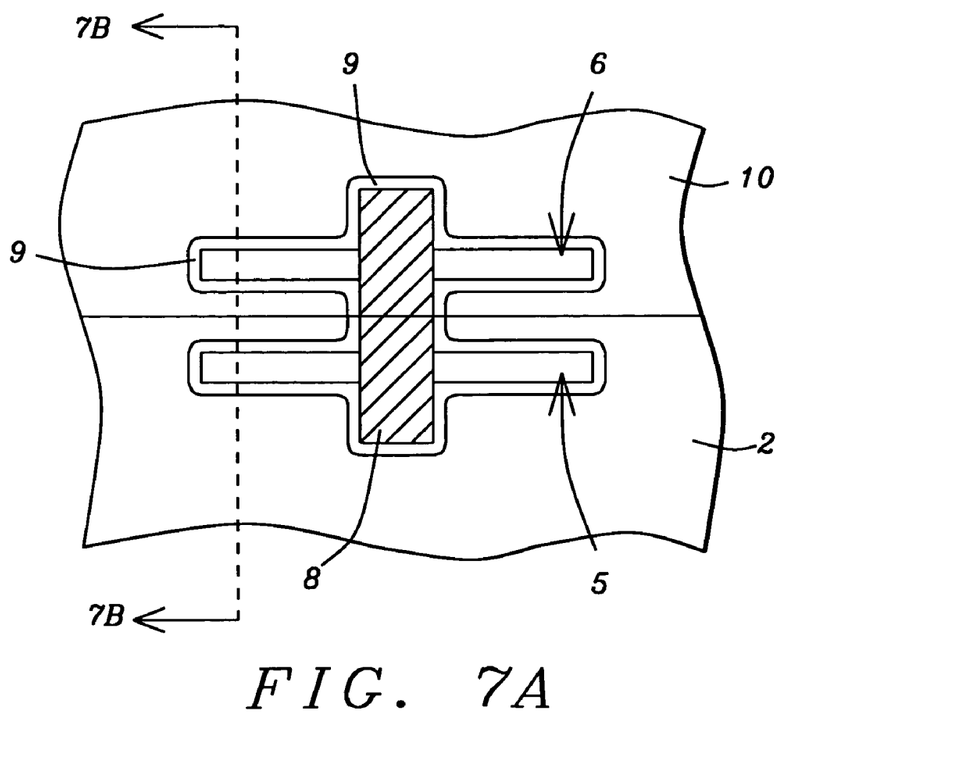
Figure 7B:
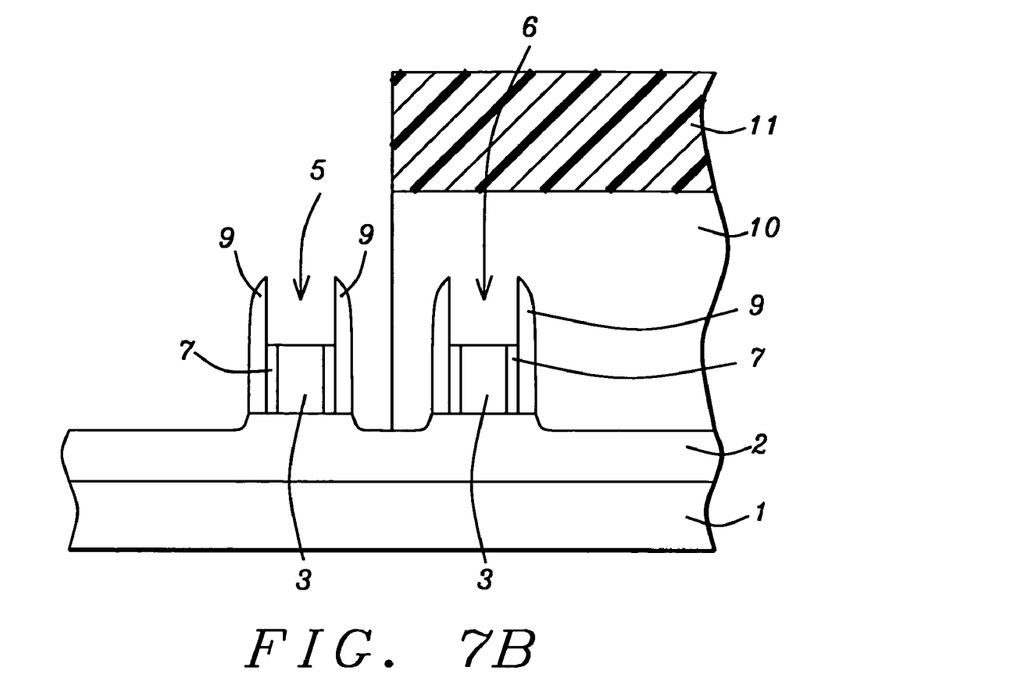

A borosilicate glass (BSG), layer 10, is next deposited at a thickness between about 100 to 2000 Angstroms, via PECVD or LPCVD procedures. The weight percent of $B_2O_3$ in BSG layer 10, is between about 3 to 10%. Photoresist shape 11, schematically shown in cross-sectional style in FIG. 7B, is used as a mask to allow removal of a portion of BSG layer 10, in a region to be used to accommodate a subsequent NMOS FINFET device, to be accomplished. Removal of the exposed portion of BSG layer 10, is achieved via a RIE procedure using $CHF_3$ as an etchant, or via a wet etch procedure using a buffered hydrofluoric (BHF) acid solution as an etchant. A top view showing BSG layer only overlying a subsequent PMOS FINFET device region, is schematically shown in FIG. 7A.

Figure 8A:
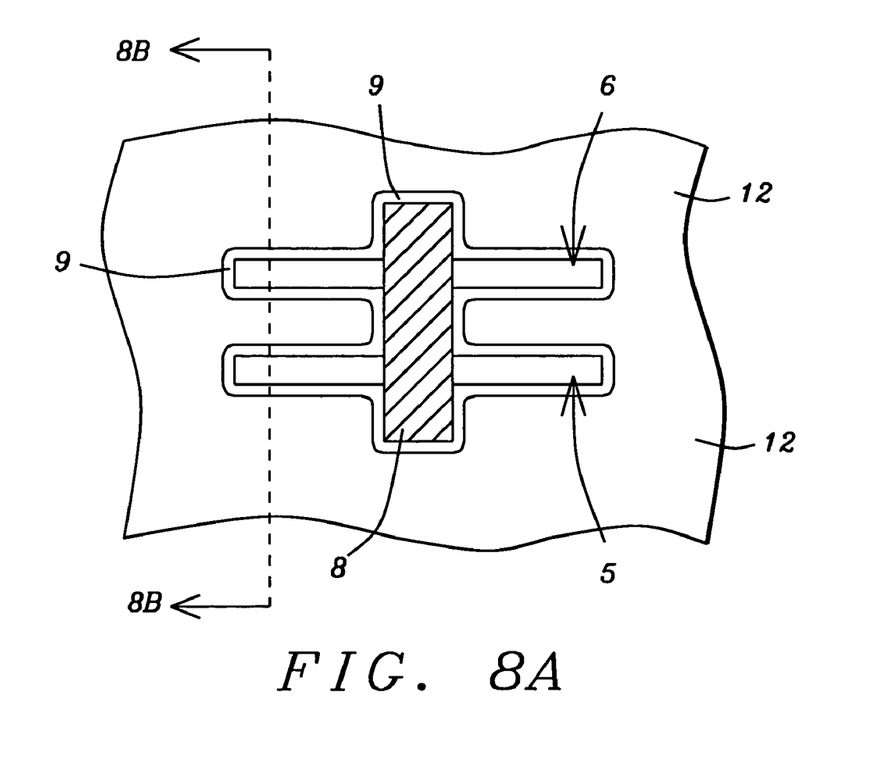
Figure 8B:
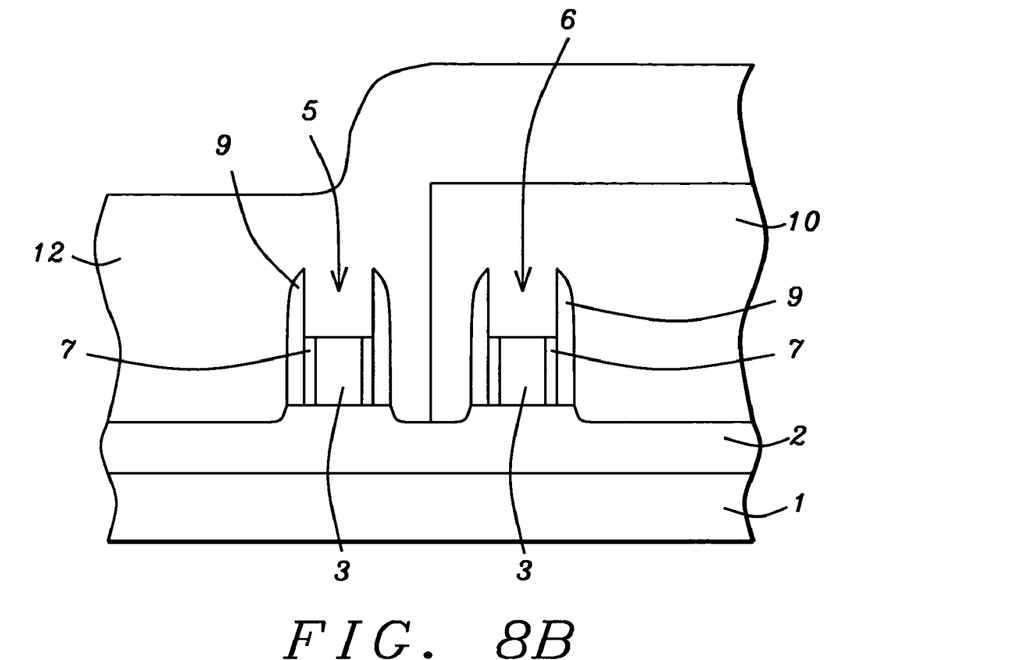

After removal of photoresist shape 11, via plasma oxygen ashing procedures, phosphosilicate glass (PSG) layer 12, is deposited at a thickness between about 100 to 20000 Angstroms via LPCVD or PECVD procedures. The weight percent of $P_2O_5$ in PSG layer 12, is between about 3 to 10%. A first portion of PSG layer 12, directly overlays only a region to be used to accommodate an NMOS FINFET device, shown schematically in cross-sectional style in FIG. 8B, while a second portion of PSG layer overlays BSG layer 10, in a subsequent PMOS FINFET device region. This is also schematically shown as a top view using FIG. 8A.

Figure 9A:
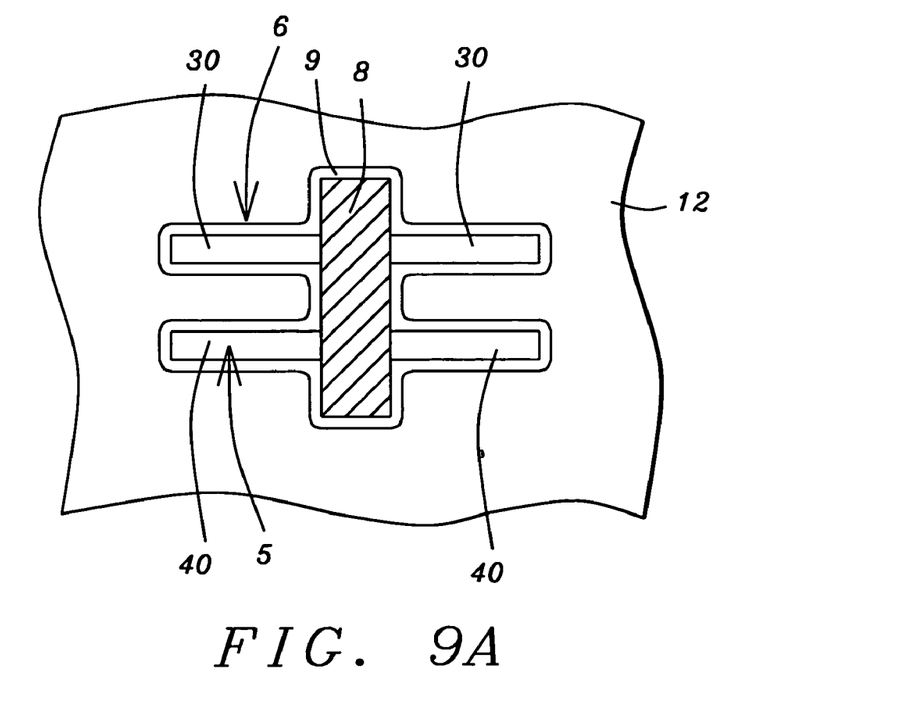
Figure 9B:
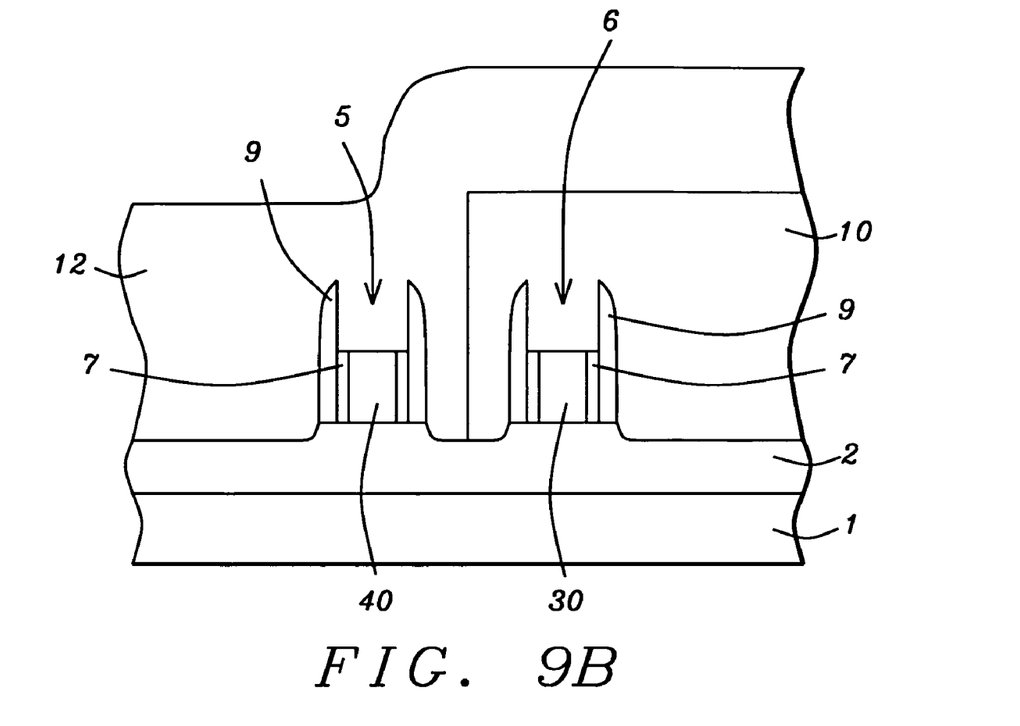

An anneal procedure is next performed at a temperature between about 700 to 1000° C., for a time between about 1 to 60 min, in a conventional furnace, or via use of rapid thermal anneal (RTA) procedures. The anneal procedure allows the doping of the exposed SOI shapes which directly underlay the doped insulator layer, resulting in doped source/drain regions. The portion of FINFET shape 5, underlying PSG layer 12, is now N type source/drain region 40, while the portions of FINFET shape 6, underlying BSG layer 10, is now P type source/drain region 30. This is schematically shown in cross-sectional style in FIG. 9B, and as a top view using FIG. 9A. Therefore a desired NMOS FINFET device, featuring N type source/drain region 40, and a desired PMOS FINFET device, featuring P type source/drain region 30, is defined in the same SOI layer.

Figure 10:
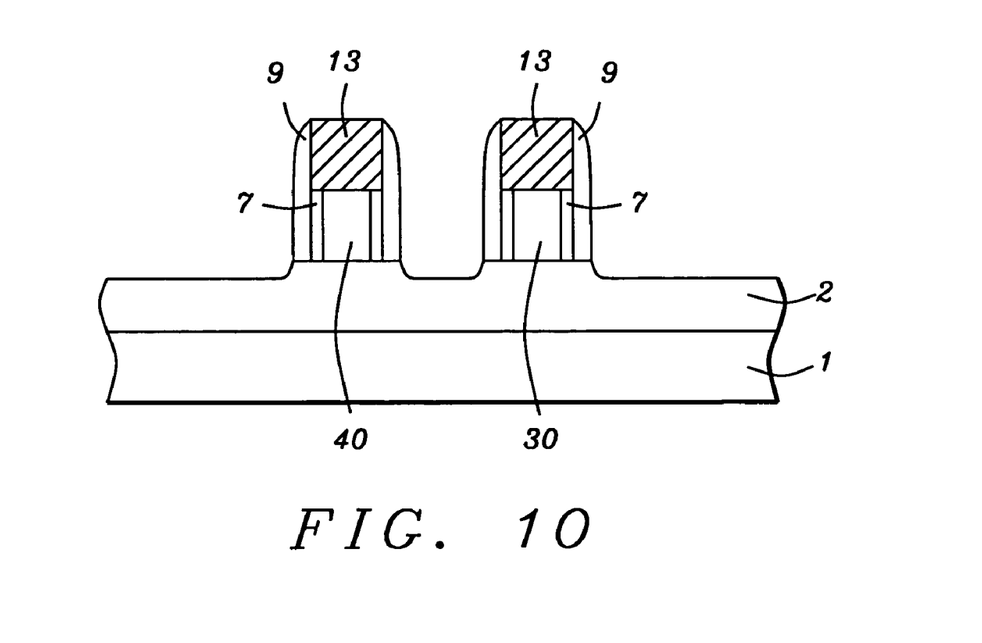

Removal of PSG layer 12, and of BSG layer 10, is next addressed using a BHF acid solution, exposing the top surface of N type source/drain region 40, and of P type source/drain region 30. Selective deposition of a metal layer, at a thickness between about 100 to 3000 Angstroms, is next performed resulting in metal shapes 13, overlying the doped source/drain regions. The presence of metal shapes 13, allow a reduction in source/drain resistance to be realized. A metal layer such as tungsten can be used for the selective deposition procedure, performed via CVD procedures at temperature between about 500 to 1000° C., using tungsten hexafluoride as a source. The result of this procedure is schematically shown, in cross-sectional style in FIG. 10.

Figure 11A:
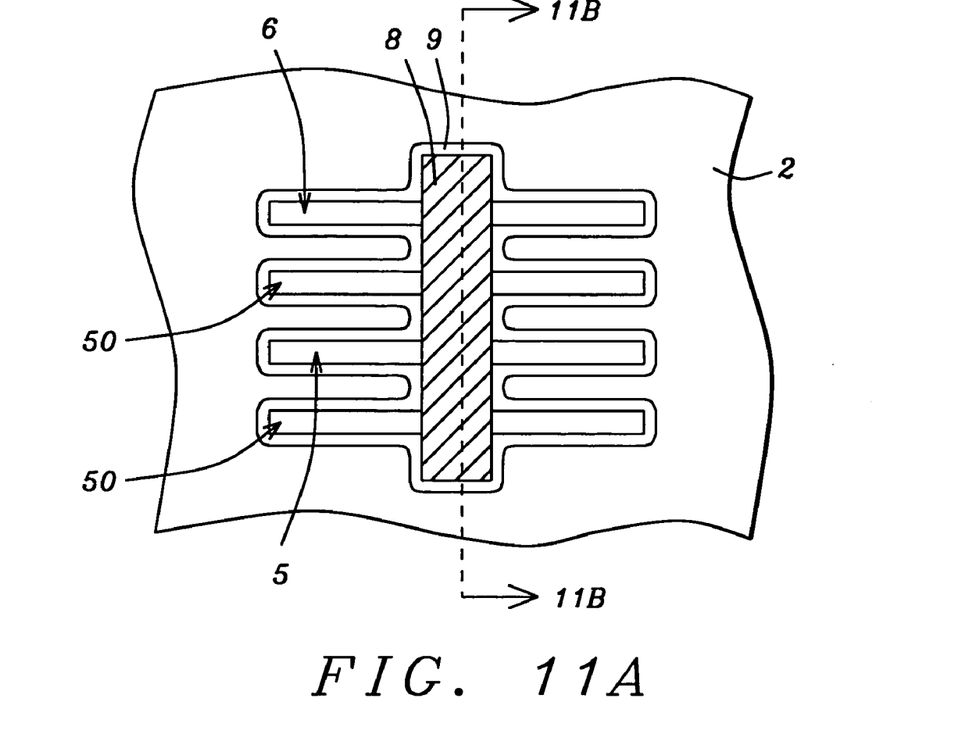
Figure 11B:
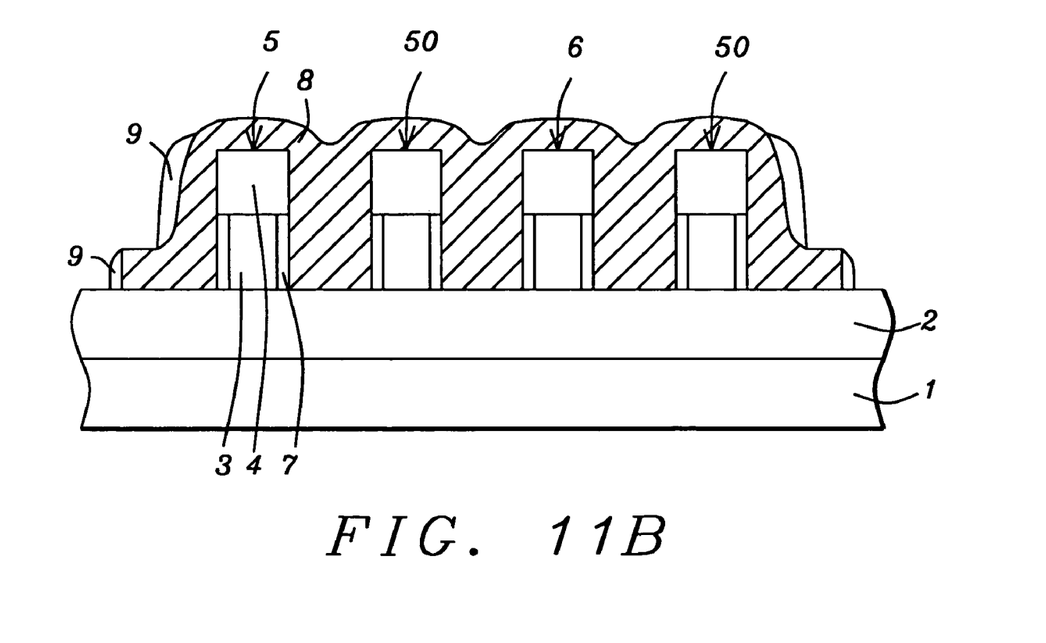

Another embodiment of this invention entails the reduction of gate resistance via filling of the spaces between FINFET shapes with the conductive metal layer used for definition of gate structure 9. This can be accomplished via use of dummy FINFET shapes 50, defined adjacent to, and in a direction parallel to, FINFET shapes 5 and 6. The reduction in the space between FINFET shapes 5 and 6, as a result of dummy FINFET shapes 50, allows the conductive metal layer to completely fill the narrower spaces, thus reducing gate resistance. This is schematically shown as a top view in FIG. 11A, while FIG. 11B, schematically shows the cross-sectional view. An additional option can a decrease in spacing between FINFET shapes 5 and 6, to a point in which the conductive metal layer completely fills the narrower space, without employing dummy FINFET shapes.

While this invention has been particularly shown and described with reference to, the preferred embodiments thereof, it will be understood by those skilled in the art that various changes in form and details may be made without departing from the spirit and scope of this invention.

What is claimed is:

1. A FINFET complimentary metal oxide semiconductor (CMOS) device structure, comprising:
    an insulator layer on a semiconductor substrate;
    a first raised silicon on insulator (SOI), FINFET structure on said insulator layer;
    a second raised SOI FINFET structure on said insulator layer, parallel in direction to said first raised SOI FINFET structure;
    a gate insulator layer on the sides of a center portion of said first raised SOI FINFET structure, and on sides of a center portion of said second raised SOI FINFET structure;
    insulator shapes on a top surface of said center portion of said first raised SOI FINFET structure, and on a top surface of said center portion of said second raised FINFET structure;
    a conductive gate structure traversing said first raised SOI FINFET structure and said second raised SOI FINFET structure, with said conductive gate structure interfacing said gate insulator layer located on sides of the raised SOI FINFET structures, and overlying said insulator shapes located on the top surface of center portions of said raised SOI FINFET structures;
    insulator spacers, on sides of said raised SOI FINFET structures, and on sides of said conductive gate structure, each insulator spacer having a convex wall, comprised of silicon nitride, and at a thickness between about 300 to 5000 Angstroms;
    a first source/drain region of a first conductivity type in portions of said first raised SOI FINFET structure not covered by said gate structure, and a second source/drain region of a second conductivity type in portions of said second raised SOI FINFET structure not covered by said conductive gate structure; and
    metal shapes on said first source/drain region and on said second source/drain region;
    wherein a portion of the insulator spacers substantially surrounds the first source/drain region and another portion of the insulator spacers substantially surrounds the second source/drain region.

2. The FINFET CMOS device structure of claim 1, wherein the thickness of said raised SOI FINFET structures is between about 50 to 5000 Angstroms.

3. The FINFET CMOS device structure of claim 1, wherein said gate insulator layer is comprised of silicon dioxide, at a thickness between about 10 to 100 Angstroms.

4. The FINFET CMOS device structure of claim 1, wherein said conductive gate structure is comprised of a material chosen from a group containing doped polysilicon, aluminum, aluminum-copper, tungsten, tantalum, tungsten silicide, tantalum silicide, nickel silicide, cobalt silicide, or titanium silicide.

5. The FINFET CMOS device structure of claim 1, wherein said first source/drain region of a first conductivity type, is an N type source/drain region.

6. The FINFET CMOS device structure of claim 1, wherein said second source/drain region of a second conductivity type, is a P type source/drain region.

7. The FINFET CMOS device structure of claim 1, wherein said metal shapes, located on the source/drain regions, are comprised of tungsten.

8. A FINFET complimentary metal oxide semiconductor (CMOS) device structure, comprising:
    an insulator layer on a semiconductor substrate;
    a second raised SOI FINFET structure on said insulator layer, parallel in direction to said first raised SOI FINFET structure;
    a conductive gate structure traversing said first and second raised SOI FINFET structures and electrically isolated from said first and second raised SOI FINFET structures; and
    a first source/drain region of a first conductivity type in portions of said first raised SOI FINFET structure not covered by said gate structure, and a second source/drain region of a second conductivity type in portions of said second raised SOI FINFET structure not covered by said conductive gate structure;
    wherein the conductive gate structure completely fills a space between first and second raised SOI FINFET structures.

9. A FINFET complimentary metal oxide semiconductor (CMOS) device structure, comprising:
    an insulator layer on a semiconductor substrate;
    a first raised silicon on insulator (SOI), FINFET structure on said insulator layer;
    a second raised SOI FINFET structure on said insulator layer, parallel in direction to said first raised SOI FINFET structure;
    a dummy raised SOI FINFET structure on said insulator layer, located between said first and second raised SOI FINFET structures;

a conductive gate structure traversing said first raised SOI FINFET structure and said second raised SOI FINFET structure and electrically isolated from said first and second raised SOI FINFET structures; and a first source/drain region of a first conductivity type in portions of said first raised SOI FINFET structure not covered by said gate structure, and a second source/drain region of a second conductivity type in portions of said second raised SOI FINFET structure not covered by said conductive gate structure;

wherein the conductive gate structure completely fills a first space between dummy and first raised SOI FINFET structures and a second space between dummy and second raised SOI FINFET structures.

10. A FINFET complimentary metal oxide semiconductor (CMOS) device structure, comprising:

an insulator layer on a semiconductor substrate;

a first raised silicon on insulator (SOI), FINFET structure on said insulator layer;

a second raised SOI FINFET structure on said insulator layer, parallel in direction to said first raised SOI FINFET structure;

a gate insulator layer on the sides of a center portion of said first raised SOI FINFET structure, and on sides of a center portion of said second raised SOI FINFET structure;

insulator shapes on a top surface of said center portion of said first raised SOI FINFET structure, and on a top surface of said center portion of said second raised FINFET structure;

a conductive gate structure traversing said first raised SOI FINFET structure and said second raised SOI FINFET structure, with said conductive gate structure interfacing said gate insulator layer located on sides of the raised SOI FINFET structures, and overlying said insulator shapes located on the top surface of center portions of said raised SOI FINFET structures;

insulator spacers, on sides of said raised SOI FINFET structures, and on sides of said conductive gate structure, each insulator spacer having a convex wall;

a first source/drain region of a first conductivity type in portions of said first raised SOI FINFET structure not covered by said gate structure, and a second source/drain region of a second conductivity type in portions of said second raised SOI FINFET structure not covered by said conductive gate structure; and metal shapes on said first source/drain region and on said second source/drain region;

wherein said insulator spacers are comprised of silicon nitride, at a thickness between about 300 to 5000 Angstroms.

* * * * *